United States Patent
Cannillo et al.

(10) Patent No.: US 11,424,680 B2
(45) Date of Patent: Aug. 23, 2022

(54) SINGLE INDUCTOR DUAL INPUT BUCK CONVERTER WITH REVERSE CAPABILITY

(71) Applicant: Dialog Semiconductor (UK) Limited, London (GB)

(72) Inventors: Francesco Cannillo, Munich (DE); Holger Petersen, Pastetten (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/919,880

(22) Filed: Jul. 2, 2020

(65) Prior Publication Data

US 2021/0265913 A1    Aug. 26, 2021

(30) Foreign Application Priority Data

Feb. 24, 2020    (DE) .......................... 102020202354.9

(51) Int. Cl.
     *H02M 3/158*      (2006.01)
     *G01R 19/165*      (2006.01)
     (Continued)

(52) U.S. Cl.
     CPC .... *H02M 3/1584* (2013.01); *G01R 19/16528* (2013.01); *G05F 1/465* (2013.01);
     (Continued)

(58) Field of Classification Search
     CPC ..... G05F 1/00; G05F 1/10; G05F 1/12; G05F 1/46; G05F 1/455; G05F 1/45;
     (Continued)

(56) References Cited

U.S. PATENT DOCUMENTS 7,170,197 B2 *    1/2007    Lopata .................... H02M 1/10
                                                          307/70
8,624,429 B2 *    1/2014    Jing ....................... H02M 3/158
                                                          307/18
(Continued)

FOREIGN PATENT DOCUMENTS

DE      10 2014 223 355 A1      5/2015
WO      WO-2015164970 A1 *    11/2015    ................ H02J 1/02

OTHER PUBLICATIONS

Intel Technology Brief, "Power Loss Imminent (PLI) Technology," Intel Solid-State Drives, pp. 1-8, Copyright 2014, Intel Corporation, 330275-001 US.

(Continued)

*Primary Examiner* — Thienvu V Tran
*Assistant Examiner* — Nusrat Quddus
(74) *Attorney, Agent, or Firm* — Saile Ackerman LLC; Stephen B. Ackerman

(57) ABSTRACT

The present document relates to Single Inductor Dual Input (SIDI) buck power converters. More specifically, a dual input power converter may comprise an inductor, a first high-side switching element, a second high-side switching element, and a low-side switching element. The inductor may be coupled between an intermediate node and an output of the dual input power converter. The first high-side switching element may be coupled between a first input of the dual input power converter and the intermediate node. The second high-side switching element may be coupled between a second input of the dual input power converter and the intermediate node. The low-side switching element may be coupled between the intermediate node and a reference potential.

14 Claims, 7 Drawing Sheets

(51) Int. Cl.
*G06F 1/30* (2006.01)
*G05F 1/46* (2006.01)
*H02M 1/00* (2006.01)

(52) U.S. Cl.
CPC ............. *G06F 1/30* (2013.01); *H02M 1/0006* (2021.05); *H02M 1/0009* (2021.05)

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/145; H02M 3/15; H02M 3/155; H02M 3/1588; H02M 2003/1566; H02M 3/135; H02M 3/156; H02M 3/158; H02M 2003/1557; H02M 3/1582; H02M 3/1584; H02M 7/068; H02M 7/153; H02M 7/106; H02M 7/19; H02M 7/493; H02M 7/53806; H02M 7/538466; H02M 7/53875; H02M 1/084; H02M 3/285; H02M 3/33561; H02M 7/49; H02M 1/045; H02M 7/006; H02M 7/06; H02M 7/10; H02M 1/088; H02M 7/103; H02M 7/08; H02M 7/17; H02M 2001/007; H02M 7/5381; H02M 7/483; H02M 7/217; H02M 7/5387; H02M 7/53871; H02M 7/53873; H02M 1/0845; H05B 39/048; H05B 2215/069; H02J 3/46; H02J 3/38; H04B 2215/069
See application file for complete search history.

(56) References Cited

U.S. PATENT DOCUMENTS

| | | | | |
|---|---|---|---|---|
| 9,099,919 | B2* | 8/2015 | Jing | H02M 3/158 |
| 9,411,387 | B2 | 8/2016 | Obala Bhuvanesh et al. | |
| 9,680,372 | B1* | 6/2017 | Kellogg | H02M 3/07 |
| 9,835,655 | B2* | 12/2017 | Ozawa | G01R 19/0092 |
| 10,103,620 | B1* | 10/2018 | Wei | H02M 3/07 |
| 2005/0068010 | A1* | 3/2005 | Chen | H02M 3/158 323/210 |
| 2005/0105227 | A1* | 5/2005 | Chen | H02M 3/1588 361/82 |
| 2005/0264271 | A1 | 12/2005 | Lam et al. | |
| 2006/0022640 | A1* | 2/2006 | Frith | H02J 1/001 320/125 |
| 2006/0170400 | A1* | 8/2006 | Pai | H02M 3/158 323/265 |
| 2007/0018502 | A1* | 1/2007 | Bazinet | H02M 1/10 307/80 |
| 2008/0239772 | A1* | 10/2008 | Oraw | H02M 3/07 363/60 |
| 2009/0219054 | A1* | 9/2009 | Toumazou | H03K 19/00384 326/115 |
| 2010/0039080 | A1* | 2/2010 | Schoenbauer | H02M 3/1582 323/234 |
| 2014/0009106 | A1* | 1/2014 | Andrea | H02H 9/002 320/126 |
| 2014/0232359 | A1* | 8/2014 | Dash | H02M 3/158 323/235 |
| 2014/0246908 | A1* | 9/2014 | Chew | H02M 3/158 307/24 |
| 2016/0141957 | A1* | 5/2016 | Ozawa | H02M 3/156 323/271 |
| 2016/0306371 | A1* | 10/2016 | Svorc | H02M 3/1588 |
| 2016/0380455 | A1* | 12/2016 | Greening | H02J 1/00 320/114 |
| 2019/0109486 | A1* | 4/2019 | Chiu | H02J 9/061 |
| 2019/0312514 | A1* | 10/2019 | Hukel | H02M 3/07 |
| 2020/0266719 | A1* | 8/2020 | Oh | H02M 7/5387 |
| 2021/0203179 | A1* | 7/2021 | Gambetta | H02M 3/1582 |

OTHER PUBLICATIONS

Gorvo, ACT88430, "Advanced PMU for Microcontrollers and Solid State Drive Applications," Data Sheet Rev. 3.0, Nov. 11, 2019, www.gorvo.com, pp. 1-51.

Gorvo, ACT88325, "Advanced PMU with 3 Bucks, 2 LDOs and Load Bypass Switch," Data Sheet Rev. 4.0, Feb. 5, 2020, www.gorvo.com, pp. 1-47.

Gorvo, ACT88320, "Advanced PMU with Inrush Control and Bypass Switch," Data Sheet Rev. 5.0, Nov. 11, 2019, www.gorvo.com, pp. 1-59.

Gorvo, ACT8870, "Advanced PMU for Microcontrollers and Solid State Drive Applications," Data Sheet Rev. 7.0, Feb. 18, 2020, www.gorvo.com, pp. 1-49.

German Office Action, File No. 10 2020 202 354.9, Applicant: Dialog Semiconductor (UK) Limited, dated Sep. 3, 2020, 5 pages.

German Office Action, File No. 10 2020 202 354.9, Applicant: Dialog Semiconductor (UK) Limited, dated Feb. 25, 2022, 8 pages.

* cited by examiner

SINGLE INDUCTOR DUAL INPUT BUCK CONVERTER WITH REVERSE CAPABILITY

TECHNICAL FIELD

The present document relates to DC (Direct Current)/DC power converters. In particular, the present document relates to Single Inductor Dual Input (SIDI) buck power converters capable of operating as Power Loss Protection (PLP) devices.

BACKGROUND

PLP is typically required in enterprise (servers, data centers, etc.) applications to avoid data loss in case of power loss during data-write operations on the memory.

As illustrated in FIG. 1, the root of an SSD power tree may comprise a PLP integrated circuit (PLP IC) and a pre-regulator buck power converter. The pre-regulator buck power converter converts the input voltage $V_{IN}$ (e.g. 12 V) down to $V_{OUT\_PRE}$ (e.g. 5 V) in order to feed a low voltage Power Management Integrated Circuit (PMIC) that generates the rails required by the different parts of the SSD module (such as e.g. DRAM, flash memory, or the controller). The PLP IC features a boost/buck dc-dc converter and an isolation switch S. While $V_{IN}$ is applied, the isolation switch is closed so that $V_{IN\_B}=V_{IN}$ and the boost/buck dc-dc converter operates as a boost power converter that stores energy on a bank of hold-up capacitors $C_H$ (hundreds of uF).

FIG. 2 shows the transient voltages of $V_{IN}$, $V_{IN\_B}$ and $V_H$ in case of a power loss event. If $V_{IN}$ is removed, the boost/buck dc-dc converter operates as a buck power converter supplied by $V_H$ ($>V_{IN}$; up to 40 V) and regulates $V_{IN\_B}$ for a hold-up time $T_H$ (tens of ms) sufficient to perform the last write operation on the flash memory. The isolation switch may be open to avoid any leakage current towards $V_{IN}$. In addition, when the isolation switch is open, two back-to-back diodes D1 and D2 connected in parallel to the isolation switch may prevent any current flow between $V_{IN}$ and $V_{IN\_B}$.

SUMMARY

This document describes a novel Power Loss Protection (PLP) solution which may be used e.g. in the field of Solid-State Drives (SSDs).

The present document addresses the above-described technical problems. In particular, the present document addresses the technical problem of providing a power converter capable of operating as a PLP device, wherein this power converter comprises a reduced number of circuit elements, and thereby reduces the required circuit area.

According to an aspect, a dual input power converter is presented. The dual input power converter may comprise an inductor, a first (high-side) switching element, a second (high-side) switching element, and a low-side switching element. The inductor may be coupled between an intermediate node and an output of the dual input power converter. The first switching element may be coupled between a first input of the dual input power converter and the intermediate node. The second switching element may be coupled between a second input of the dual input power converter and the intermediate node. The low-side switching element may be coupled between the intermediate node and a reference potential.

Similar as the power tree depicted in FIG. 1, the described dual input power converter is capable of operating as a pre-regulator as well as a PLP device. However, compared to the solution in FIG. 1, only a single inductor and a single output capacitor may be required. As will be explained in the following description, an energy storage device (such as e.g. one or more capacitors) may be connected to the second input, and the dual input power converter may be configured to periodically (re-)charge the energy storage device by allowing the inductor current to become negative for short periods, and by redirecting the negative inductor current to the second input. In case of a power loss event at the first input, the power converter may be configured to switch from the first input to the second input and may prevent e.g. data loss during an on-going data write operation. Each of the three switching elements may be implemented with any suitable device, such as, for example, a metal-oxide-semiconductor field effect transistor MOSFET, an insulated-gate bipolar transistor IGBT, a MOS-gated thyristor, or any other suitable power device. At this, the switching elements may be identical or different from each other. Each switching element may have a gate to which a respective driving voltage or control signal may be applied to turn the switching element on (i.e. to close the switching element) or to turn the switching element off (i.e. to open the switching element).

The first switching element may be configured to prevent current flow in both directions when it is open. To this end, the first switching element may be implemented using two transistor switches in series, wherein the two transistor switches are coupled such that the body diodes of the two transistor switches are oriented with opposed directions. In other words, the presence of two back-to-back diodes may be required to provide a full isolation between the first input of the power converter and the intermediate node.

Throughout this document, the term "reference potential" is meant in its broadest possible sense. In particular, the reference potential is not limited to ground i.e. a reference potential with a direct physical connection to earth. Rather, the term "reference potential" may refer to any reference point to which and from which electrical currents may flow or from which voltages may be measured. Moreover, it should be mentioned that the reference potentials mentioned in this document may not necessarily refer to the same physical contact. Instead, the reference potentials mentioned in this document may related to different physical contacts although reference is made to "the" reference potential for ease of presentation.

The dual input power converter may be configured to down-convert, during a first buck operation state, a first input voltage at the first input to an output voltage at the output. The dual input power converter may be configured to down-convert, during a second buck operation state, a second input voltage at the second input to the output voltage at the output. The dual input power converter may be configured to up-convert, during a back-boost operation state, the output voltage to the second input voltage.

In other words, during the first buck operation state, power (or current) may flow from the first input to the output, wherein the output voltage may be regulated to be smaller than the first input voltage. During the second buck operation state, power (or current) may flow from the second input to the output, wherein the output voltage may be regulated to be smaller than the second input voltage. During, the back-boost operation state, which may be also denoted as reverse-boost operation state, power (or current) may flow from the output to the second input, wherein the second input voltage may be regulated to be greater than the output voltage.

The dual input power converter may further comprise a storage capacitor coupled to the second input, and the dual input power converter may be configured to switch from the first buck operation state to the back-boost operation state when a voltage across the storage capacitor falls below a target voltage. The dual input power converter may comprise a comparator configured to compare the voltage across the storage capacitor (or alternatively the second input voltage) with the target voltage, and the dual input power converter may be configured to switch from the first buck operation state to the back-boost operation state based on a result of the comparison. In particular, the dual input power converter may be configured to generate one or more charging pulses for charging the storage capacitor in the back-boost operation state if the voltage across the storage capacitor falls below the target voltage.

The dual input power converter may be configured to generate, during the back-boost operation state, a negative inductor current flowing from the output, via the inductor, via the intermediate node, via the second switching element to the second input. In particular, the back-boost operation state may comprise a first sub-state and a second sub-state. The dual input power converter may be configured to, during the first sub-state, open the first switching element, open the second switching element, and close the low-side switching element. The dual input power converter may be configured to, during the second sub-state, open the first switching element, and open the low-side switching element. Therefore, during the first sub-state, the voltage difference between the output and the reference potential may result in a (linearly) decreasing inductor current, which may eventually become negative i.e. may flow from the output, via the inductor, via the intermediate node to the reference potential. This negative inductor current—which is generated during the first sub-state—may be subsequently, in the second sub-state, redirected towards the second input and may be used to charge the storage capacitor. At this, the second switching element may be open during the second sub-state and the negative inductor current may flow through the body diode of the second switching element. Alternatively, the second switching element may be closed during the second sub-state to reduce losses.

The dual input power converter may be configured to switch from the first sub-state to the second sub-state when a current through the low-side switching element (or alternatively a current through the inductor) reaches a threshold current. The dual input power converter may be configured to switch back from back-boost operation state to the first buck operation state when the inductor current reaches zero. As a result, during the second sub-state of the back-boost operation state, a charging pulse may be generated by the negative inductor current.

The dual input power converter may be configured to, during the first buck operation state, alternately establish a magnetizing current path and a demagnetizing current path. The magnetizing current path may flow from the first input, via the first switching element, via the inductor to the output. The demagnetizing current path may flow from the reference potential, via the low-side switching element, via the inductor, to the output. The dual input power converter may be configured to, during the first buck operation state, open the second switching element in order to decouple the second input from the intermediate node.

For example, the dual input power converter may be configured to establish the magnetizing current path during a first time interval and subsequently establish the demagnetizing current path during a second time interval. The dual input power converter may be configured to determine the lengths of the first time interval and the second time interval based on a difference between the output voltage and a target value of the output voltage. In this the regard, the power converter may comprise a feedback loop for providing a Pulse Width Modulation (PWM) control for the first switching element and the low-side switching element during the first buck operation state. At the end of the second time interval, the dual input power converter may decide, based on the voltage across the storage capacitor, to switch either to the back-boost operation state (if the voltage across the storage capacitor falls below its target voltage) or to another first buck operation state (if the voltage across the storage capacitor stays above its target voltage).

In a similar manner, the dual input power converter may be configured to, during the second buck operation state, alternately establish (a) a magnetizing current path from the second input, via the second switching element, via the inductor to the output, and (b) a demagnetizing current path from the reference potential, via the low-side switching element, via the inductor, to the output. The dual input power converter may be configured to open, during the second buck operation state, the first switching element in order to prevent reverse leakage current to the first input.

The dual input power converter may comprise a fourth switching element coupled between first switching element and the intermediate node. Alternatively, the fourth switching element may also be coupled between the first input of the dual input power converter and the first switching element. In any case, the first switching element and the fourth switching element may be coupled in series between the first input of the power converter and the intermediate node. A direction of a body diode of the first switching element may be reversed with regard to a direction of a body diode of the fourth switching element.

The dual input power converter may be configured to close the fourth switching element during the first buck operation state. The dual input power converter may be configured to open the fourth switching element during the back-boost operation state. During the second buck operation state, the fourth switching element may be open.

The dual input power converter may be configured to switch from the first buck operation state to the second buck operation state if the input voltage falls below a threshold voltage. When the input voltage falls below the threshold voltage, this may indicate a power low loss event at the first input. The dual input power converter may comprise a comparator configured to compare the first input voltage with the threshold voltage, and the dual input power converter may be configured to switch from the first buck operation state to the second buck operation state based on a result of this comparison.

According to another aspect, a method for operating a dual input power converter is described. The method may comprise steps which correspond to the features of the dual input power converter described in the present document. Specifically, the method may comprise coupling an inductor between an intermediate node and an output of the dual input power converter. The method may comprise coupling a first switching element between a first input of the dual input power converter and the intermediate node. The method may comprise coupling a second switching element between a second input of the dual input power converter and the intermediate node. The method may comprise coupling a low-side switching element between the intermediate node and a reference potential.

The method may comprise down-converting, during a first buck operation state, a first input voltage at the first input to an output voltage at the output. The method may comprise down-converting, during a second buck operation state, a second input voltage at the second input to the output voltage at the output. The method may comprise up-converting, during a back-boost operation state, the output voltage to the second input voltage.

The dual input power converter may comprise a storage capacitor coupled to the second input. The method may comprise switching from the first buck operation state to the back-boost operation state when a voltage across the storage capacitor falls below a target voltage.

The method may comprise generating, during the back-boost operation state, a negative inductor current flowing from the output, via the inductor, via the intermediate node, via the second switching element to the second input. To be more specific, the back-boost operation state may comprise a first sub-state and a second sub-state, and the method may comprise, during the first sub-state, opening the first switching element, opening the second switching element, and closing the low-side switching element. Furthermore, the method may comprise, during the second sub-state, opening the first switching element, and opening the low-side switching element. The method may comprise switching from the first sub-state to the second sub-state when a current through the low-side switching element reaches a threshold current.

The method may comprise, during the first buck operation state, alternately establishing a magnetizing current path from the first input, via the first switching element, via the inductor to the output, and a demagnetizing current path from the reference potential, via the low-side switching element, via the inductor, to the output.

The dual input power converter may comprise a fourth switching element coupled between first switching element and the intermediate node. The method may comprise closing the fourth switching element during the first buck operation state. The method may comprise opening the fourth switching element during the back-boost operation state.

The method may comprise switching from the first buck operation state to the second buck operation state if the input voltage falls below a threshold voltage.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DETAILED DESCRIPTION

Figure 1:
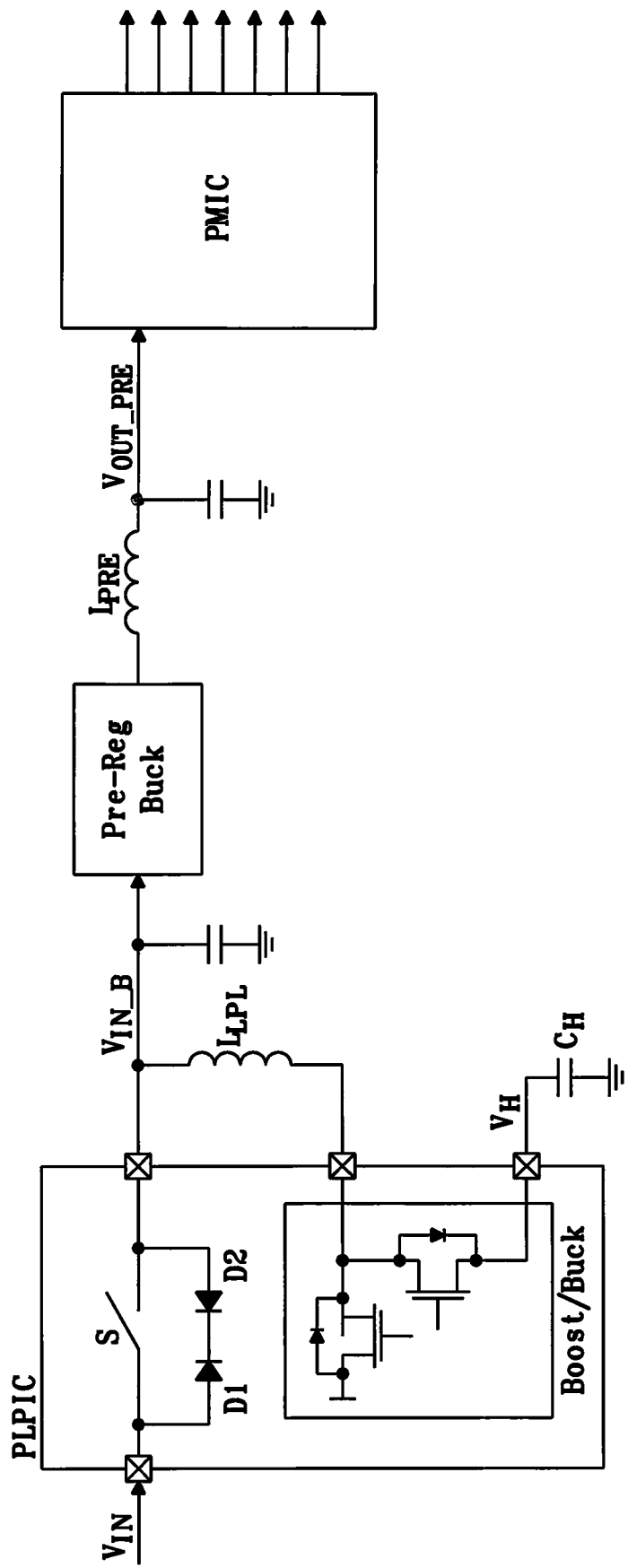
FIG. 1 shows a power tree of an SSD module with PLP capability.
Figure 2:
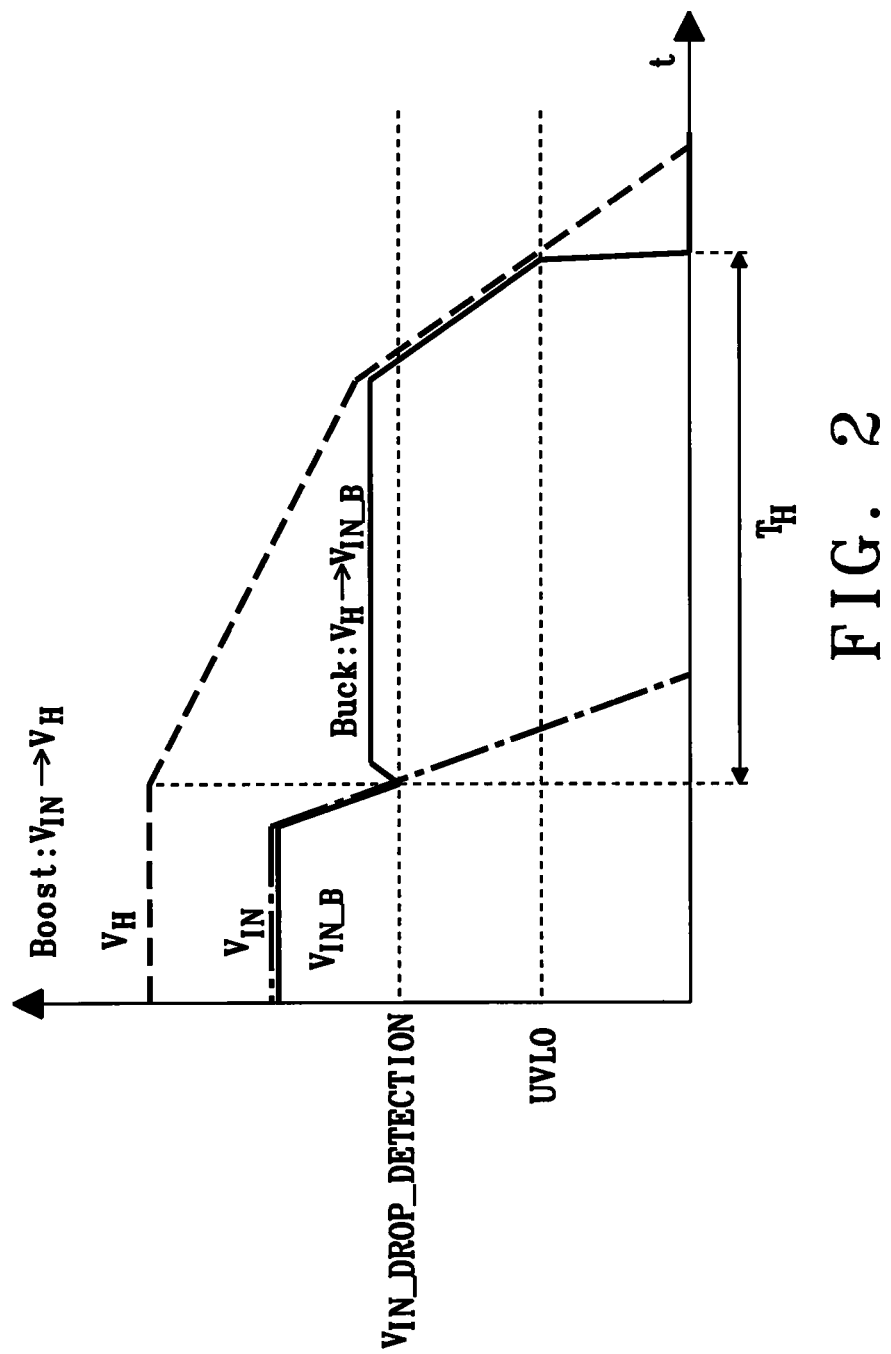
FIG. 2 shows transient voltages in case of a power loss event.
Figure 3:
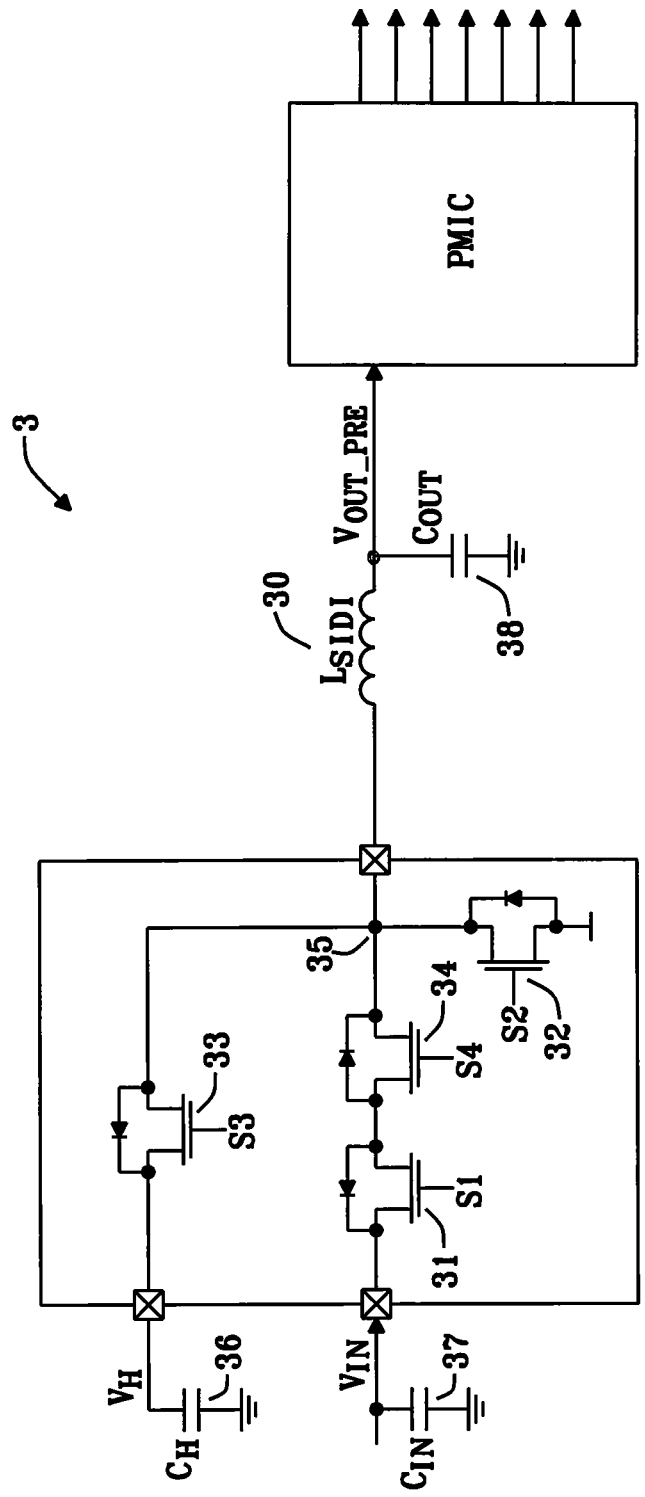
FIG. 3 shows an exemplary SIDI buck power converter.

FIG. 3 shows an exemplary SIDI buck power converter 3 able to operate as a pre-regulator as well as a PLP device. It comprises an inductor 30 coupled between an intermediate node 35 and an output of the power converter 3. A switch S1 (first high-side switching element 31) is coupled between a first input and the intermediate node 35. A switch S3 (second high-side switching element 33) is coupled between a second input of the power converter 3 and the intermediate node 35. A switch S2 (low-side switching element 32) is coupled between the intermediate node 35 and a reference potential. The power converter 3 may comprise a switch S4 (fourth high-side switching element 34) coupled between switch S1 and the intermediate node 35. Switches S1 and S4 connect to the input voltage $V_{IN}$, and switch S3 connects to the hold-up voltage $V_H$. At the first input, an input capacitor $C_{IN}$ 37 may stabilize the input voltage $V_{IN}$. At the second input, a hold-up (or storage) capacitor $C_H$ 36 may store energy for powering the PMIC at the output of the power converter 3 in case of a power loss event. At the output of the power converter 3, an output capacitor $C_{OUT}$ 38 may stabilize the output voltage $V_{OUT\_PRE}$.

When $V_{IN}$ is connected, switches S1 and S2 are switching, i.e. $V_{IN}$ is down-converted to $V_{OUT\_PRE}$ by alternately switching S1 and S2 on and off with a PWM control. Meanwhile, switch S4 may be maintained closed. If $V_{IN}$ is disconnected, the switch S3 may start switching, and $V_H$ is down-converted to $V_{OUT\_PRE}$ by switching switches S3 and S2 with a PWM control. In addition, switch S4 isolates $V_{IN}$, thereby preventing reverse leakage current.

Figure 4:
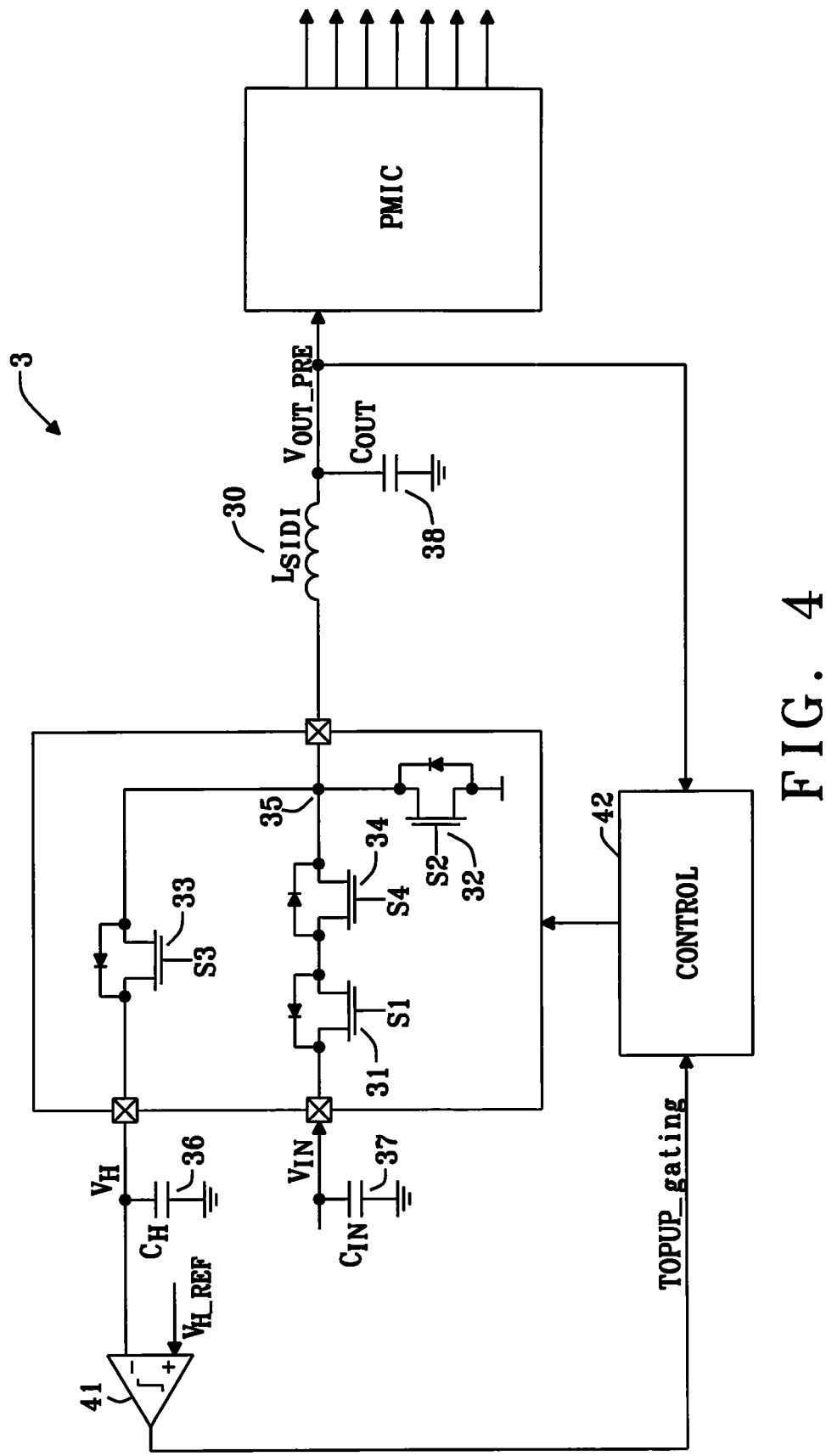
FIG. 4 shows another block diagram of the exemplary SIDI buck power converter with hold-up voltage monitoring to enable/disable back-boost operation.

FIG. 4 shows another block diagram of the exemplary SIDI buck power converter 3 with hold-up voltage monitoring to enable/disable back-boost operation. While $V_{IN}$ is present, if the voltage on $C_H$ drops below the target voltage $V_{H\_REF}$ of the storage capacitor 36, the hold-up capacitor voltage $C_H$ is regulated/increased by periodically allowing the inductor current to become negative so that it flows into the hold-up capacitor $C_H$ involving switches S2 and S3. For this purpose, the exemplary SIDI buck power converter 3 may comprise a comparator 41 and a control unit 42 for generating corresponding control signals for controlling the switches S1 to S4. Control unit 42 may also receive a feedback signal indicative for the output voltage $V_{OUT\_PRE}$, and control unit 42 may be configured to regulate the output voltage $V_{OUT\_PRE}$.

Figure 5:
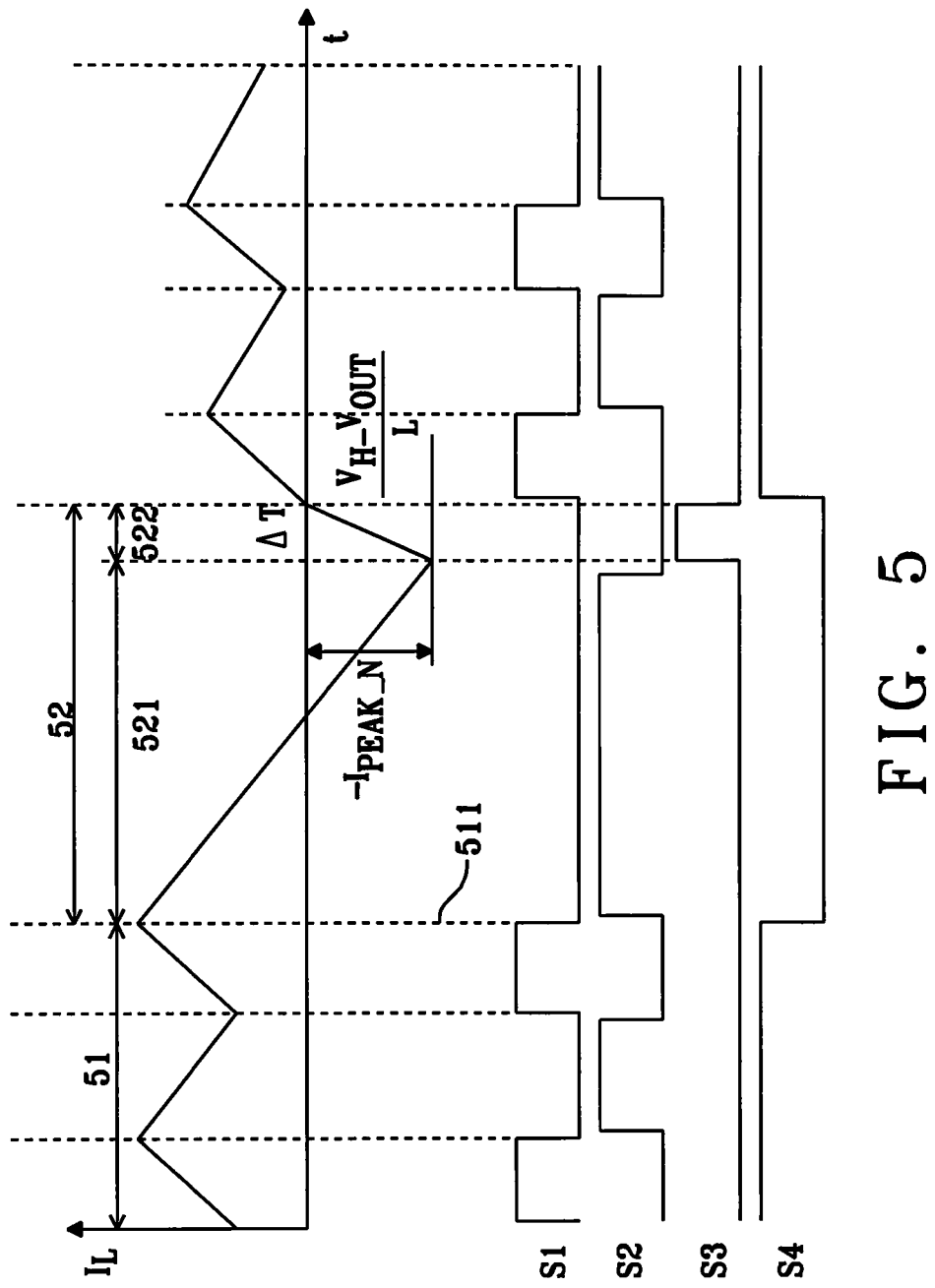
FIG. 5 shows an exemplary timing diagram of the inductor current $I_L$ and the control signals during a buck operation state and a back-boost operation state.

FIG. 5 shows an exemplary timing diagram of the inductor current $I_L$ and the control signals during a (first) buck operation state 51 and a back-boost operation state 52 of the exemplary power converter 3. During the buck operation state 51, switches S1 and S2 are switching to regulate the output voltage by magnetizing and demagnetizing the inductor 30. At time 511, the power converter switches from the (first) buck operation state 51 to the back-boost operation state 52 for charging the hold-up capacitor 36. Within this document, the back-boost operation state may also be denoted as top-up cycle, and such a top-up cycle may be triggered by a top-up event triggered by comparator 41 by generating a so-called TOPUP_gating signal. As shown in FIG. 5, the back-boost operation state 52 comprises a first sub-state 521 during which $I_L$ is decreasing until a (negative) threshold current $-1_{PEAK\_N}$ is reached. In other words, the de-magnetization phase of the buck operation state is prolonged by keeping switch S2 closed and by allowing the inductor current to reach the negative limit value $-1_{PEAK\_N}$. In the subsequent, second sub-state 522 of the back-boost operation state 522, once switch S2 is open, the inductor current is going to flow into hold-up capacitor $C_H$ through the body diode of switch S3. Switch S3 may be then closed to reduce losses. Switch S3 is maintained close until the current reaches a value of e.g. zero. The normal buck operation state may then be resumed by magnetizing the inductor by closing switches S1 and S4.

If the Top-Up Request Happens with a Period $N_{TOPUP}T_{SW}$ ($T_{SW}$ is the Switching Period), the charge provided by a single top-up event $Q_{TOPUP}$ should be higher than the charge loss due to the capacitor leakage current $I_{LEAK}$ during the same period:

$$Q_{TOPUP} < Q_{LEAK} \quad (1)$$

Here, the capacitor leakage current $I_{LEAK}$ denotes the self-discharge of the hold-up capacitor $C_H$. In FIG. 5, the top-up charge provided to $C_H$ during top-up cycle is equal to:

$$Q_{TOPUP} = I_{PEAK\_N} \cdot \Delta T/2 \quad (2)$$

On the other hand, the charge loss due to leakage can be calculated as:

$$Q_{LEAK} = I_{LEAK} \cdot N_{TOPUP} \cdot T_{SW} \quad (3)$$

Figure 6:
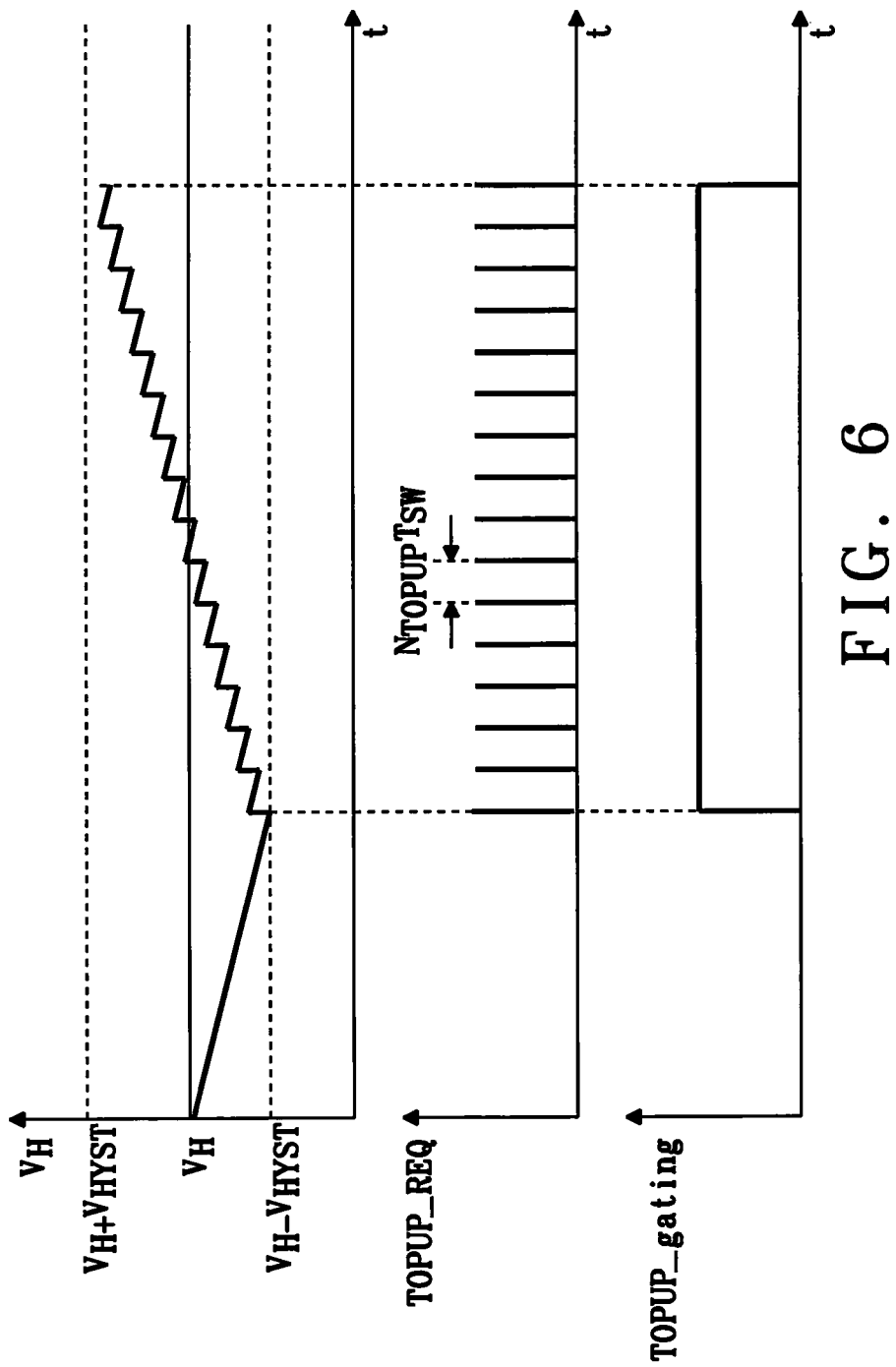
FIG. 6 shows a timing diagram of the hold-up voltage $V_H$.

FIG. 6 shows a timing diagram of the hold-up voltage $V_H$. Once the voltage $V_H$ drops with respect to the reference by an amount higher than the comparator hysteresis $V_{HYST}$, the top-up action is enabled by asserting the signal TOPUP_gating. The top-up happens at an interval $N_{TOPUP}T_{SW}$ as defined by the signal TOPUP_REQ (internal to the SIDI controller). The top-up request can have a lower priority by design with respect to the normal buck operation. Also, a signal from outside could be used to disable the top-up action of the SIDI.

The voltage rating of the power FETs used in the SIDI power converter 3 is determined by the voltages used for $V_{IN}$ and $V_H$: switches S2, S3 and S4 should be $V_H$-rated, while switch S1 needs to be $V_{IN}$-rated.

Figure 7:
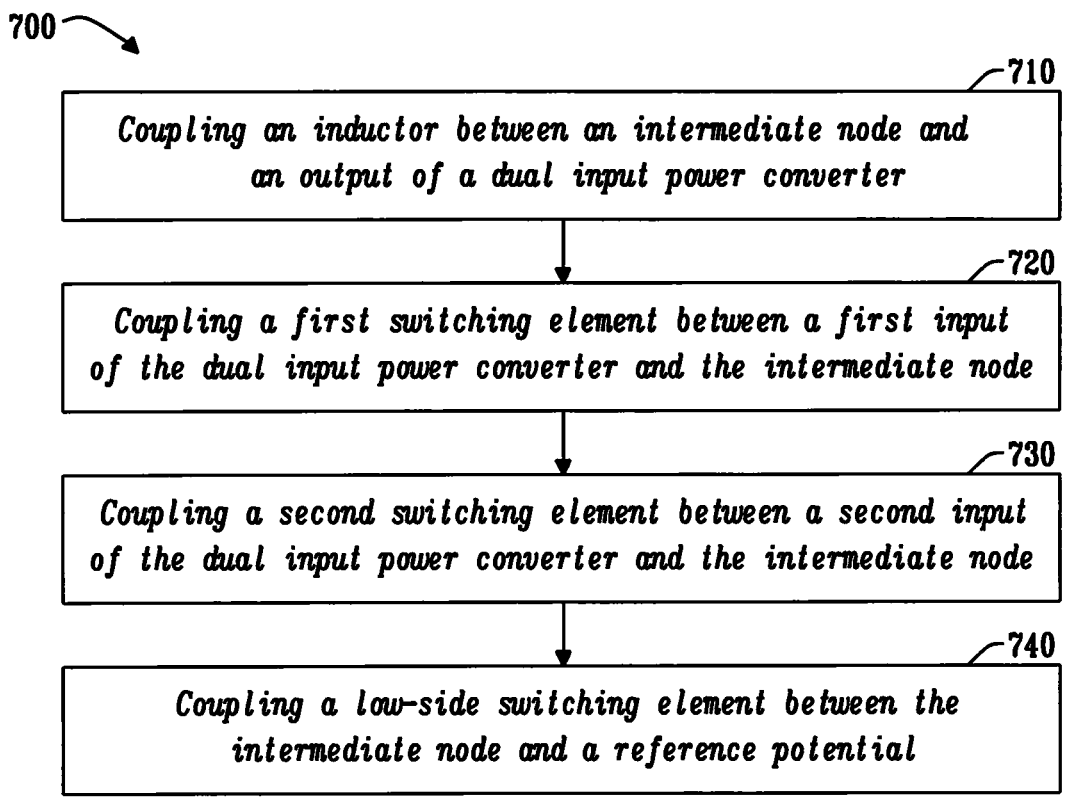
FIG. 7 shows a method of use for a single inductor dual input buck converter with reverse boost capability.

FIG. 7 shows 700, a method for operating a dual input power converter is described. The method may comprise 710, coupling an inductor between an intermediate node and an output of the dual input power converter. The method may comprise 720, coupling a first switching element between a first input of the dual input power converter and the intermediate node. The method may comprise 730, coupling a second switching element between a second input of the dual input power converter and the intermediate node. The method may comprise 740, coupling a low-side switching element between the intermediate node and a reference potential.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A dual input power converter comprising
   an inductor coupled between an intermediate node and an output of the dual input power converter;
   a first switching element coupled between a first input of the dual input power converter and the intermediate node;
   a second switching element coupled between a second input of the dual input power converter and the intermediate node; and
   a low-side switching element coupled between the intermediate node and a reference potential, wherein the dual input power converter is configured to:
   down-convert, during a first buck operation state, a first input voltage at the first input to an output voltage at the output,
   down-convert, during a second buck operation state, a second input voltage at the second input to the output voltage at the output; and
   up-convert, during a back-boost operation state, the output voltage to the second input voltage,
   wherein the back-boost operation state comprises a first sub-state and a second sub-state, and
   wherein the dual input power converter is configured to:
   during the first sub-state, open the first switching element, open the second switching element, and close the low-side switching element; and
   during the second sub-state, open the first switching element, and open the low- side switching element.

2. The dual input power converter of claim 1, further comprising a storage capacitor coupled to the second input, wherein the dual input power converter is configured to
   switch from the first buck operation state to the back-boost operation state when a voltage across said storage capacitor falls below a target voltage.

3. The dual input power converter of claim 1, wherein the dual input power converter is configured to
   generate, during the back-boost operation state, a negative inductor current flowing from the output, via the inductor, via the intermediate node, via the second switching element to the second input.

4. The dual input power converter of claim 1, wherein the dual input power converter is configured to switch from the first sub-state to the second sub-state when a current through the low-side switching element reaches a threshold current.

5. The dual input power converter of claim 1, wherein the dual input power converter is configured to, during the first buck operation state, alternately establish
a magnetizing current path from the first input, via the first switching element, via the inductor to the output, and
a demagnetizing current path from the reference potential, via the low-side switching element, via the inductor, to the output.

6. The dual input power converter of claim 1, further comprising a fourth switching element coupled between first switching element and said intermediate node, wherein the dual input power converter is configured
to close the fourth switching element during the first buck operation state, and
to open the fourth switching element during the back-boost operation state.

7. The dual input power converter of claim 1, wherein the dual input power converter is configured to
switch from the first buck operation state to the second buck operation state if the input voltage falls below a threshold voltage.

8. A method of operating a dual input power converter comprising
coupling an inductor between an intermediate node and an output of the dual input power converter;
coupling a first switching element between a first input of the dual input power converter and the intermediate node;
coupling a second switching element between a second input of the dual input power converter and the intermediate node; and
coupling a low-side switching element between the intermediate node and a reference potential,
wherein the method further comprises:
down-converting, during a first buck operation state, a first input voltage at the first input to an output voltage at the output,
down-converting, during a second buck operation state, a second input voltage at the second input to the output voltage at the output; and
up-converting, during a back-boost operation state, the output voltage to the second input voltage,
wherein the back-boost operation state comprises a first sub-state and a second sub-state, and
wherein the method further comprises:
during the first sub-state, opening the first switching element, opening the second switching element, and closing the low-side switching element; and
during the second sub-state, opening the first switching element, and opening the low-side switching element.

9. The method of claim 8, wherein the dual input power converter further comprises a storage capacitor coupled to the second input, and wherein the method comprises
switching from the first buck operation state to the back-boost operation state when a voltage across said storage capacitor falls below a target voltage.

10. The method of any one of claims 8, wherein the method comprises
generating, during the back-boost operation state, a negative inductor current flowing from the output, via the inductor, via the intermediate node, via the second switching element to the second input.

11. The method of claim 8, wherein the method comprises
switching from the first sub-state to the second sub-state when a current through the low-side switching element reaches a threshold current.

12. The method of any one of claims 8, wherein the method comprises, during the first buck operation state, alternately establishing
a magnetizing current path from the first input, via the first switching element, via the inductor to the output, and
a demagnetizing current path from the reference potential, via the low-side switching element, via the inductor, to the output.

13. The method of any one of claims 8, wherein the dual input power converter comprises a fourth switching element coupled between first switching element and said intermediate node, and wherein the method comprises
closing the fourth switching element during the first buck operation state, and
opening the fourth switching element during the back-boost operation state.

14. The method of any one of claims 8, wherein the method comprises
switching from the first buck operation state to the second buck operation state if the input voltage falls below a threshold voltage.

* * * * *